(12) United States Patent
Joo et al.

(10) Patent No.: US 11,677,060 B2
(45) Date of Patent: Jun. 13, 2023

(54) METHOD FOR TRANSFERRING AND BONDING OF DEVICES

(71) Applicant: ELECTRONICS AND TELECOMMUNICATIONS RESEARCH INSTITUTE, Daejeon (KR)

(72) Inventors: Jiho Joo, Sejong-si (KR); Yong Sung Eom, Daejeon (KR); Gwang-Mun Choi, Daejeon (KR); Kwang-Seong Choi, Daejeon (KR); Chanmi Lee, Sejong-si (KR); Ki Seok Jang, Sejong-si (KR)

(73) Assignee: ELECTRONICS AND TELEOCMMUNICATIONS RESEARCH INSTITUTE, Daejeon (KR)

( * ) Notice: Subject to any disclaimer, the term of this patent is extended or adjusted under 35 U.S.C. 154(b) by 137 days.

(21) Appl. No.: 17/228,310

(22) Filed: Apr. 12, 2021

(65) Prior Publication Data

US 2021/0320236 A1   Oct. 14, 2021

(30) Foreign Application Priority Data

Apr. 13, 2020 (KR) .................. 10-2020-0044832
Mar. 19, 2021 (KR) .................. 10-2021-0035840

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/27* (2013.01); *H01L 24/81* (2013.01); *H01L 24/83* (2013.01);
(Continued)

(58) Field of Classification Search
CPC .............. H01L 2224/8122; H01L 2224/83909
See application file for complete search history.

(56) References Cited

U.S. PATENT DOCUMENTS

| 2011/0226515 A1 | 9/2011 | Son et al. |
| 2017/0141071 A1 | 5/2017 | Choi et al. |

(Continued)

FOREIGN PATENT DOCUMENTS

| JP | 2003332184 A | 11/2003 |
| KR | 20050062886 A | 6/2005 |

(Continued)

OTHER PUBLICATIONS

Sungbum Cho et al., "Controlled adhesion force of a bendable elastomeric stamp for transferring micro semiconductor plates", The Korean Society of Mechanical Engineers, 2017.11, pp. 2853-2854.

*Primary Examiner* — Antonio B Crite
(74) *Attorney, Agent, or Firm* — Rabin & Berdo, P.C.

(57) ABSTRACT

Provided is a method for transferring and bonding devices. The method includes applying an adhesive layer to a carrier, arranging a plurality of devices, attaching the arranged devices to the carrier, applying a polymer film to a substrate, aligning the carrier to which the plurality of devices are attached with the substrate, bonding the plurality of devices to the substrate by radiating laser, and releasing the carrier from the substrate to which the plurality of devices are bonded.

12 Claims, 8 Drawing Sheets

(51) Int. Cl.
*H01L 33/56* (2010.01)
*H01L 25/075* (2006.01)
(52) U.S. Cl.
CPC .......... *H01L 33/56* (2013.01); *H01L 25/0753* (2013.01); *H01L 2224/2712* (2013.01); *H01L 2224/2919* (2013.01); *H01L 2224/8112* (2013.01); *H01L 2224/8122* (2013.01); *H01L 2224/83909* (2013.01); *H01L 2924/0715* (2013.01); *H01L 2924/12041* (2013.01); *H01L 2933/005* (2013.01); *H01L 2933/0066* (2013.01)

(56) References Cited

U.S. PATENT DOCUMENTS

2019/0043843 A1* 2/2019 Liu ................... H01L 25/0753
2021/0272935 A1* 9/2021 Wang .................. H01L 22/22

FOREIGN PATENT DOCUMENTS

| KR | 2019-0024633 A | * | 3/2019 | .......... H01L 21/185 |
| KR | 10-2020-0007498 A | | 1/2020 | |
| KR | 10-2020-0012356 A | | 2/2020 | |

* cited by examiner

METHOD FOR TRANSFERRING AND BONDING OF DEVICES

CROSS-REFERENCE TO RELATED APPLICATIONS

This U.S. non-provisional patent application claims priority under 35 U.S.C. § 119 of Korean Patent Application No. 10-2020-0044832, filed on Apr. 13, 2020, the entire contents of which are hereby incorporated by reference.

BACKGROUND

The present disclosure herein relates to a technology of transferring and bonding a device from a carrier to a target substrate, and more particularly, to a method for moving, at one time, a plurality of devices from a carrier, on which the plurality of devices having a size of dozens of micrometers ($\mu$m) to dozens of millimeters (mm) are arranged, to a target substrate to perform a bonding process simultaneously with a transfer process.

Technology related to a method for transferring and bonding a device is used in the small device processing industry. The device may include an organic or inorganic LED, and the like.

At the present time, electronic devices are reduced in size, and most of electronic equipment include a substrate on which micro devices or a plurality of electronic components in which devices are embedded in a polymer mold are arranged. For example, a display apparatus may use pixels including light emitting diodes (LEDs) having a size of dozens or hundreds of micrometers. For example, red/green/blue (R/G/B) pixels are required to be densely arranged so as to use an inorganic LED as a pixel. Here, semiconductor materials capable of emitting red, green, and blue light are different. Therefore, individually manufactured red/green/blue LEDs are required to be moved (i.e., transferred) to a substrate after being diced from each wafer. Therefore, a bonding process may be performed to complete an electrical connection to the substrate by melting solder of bonding portions of moved micro devices. Various researches are carried out to satisfy requirements related to quick execution of transfer and bonding processes.

SUMMARY

The present disclosure is intended to reduce a manufacturing process time of an electronic apparatus for which a plurality of micro devices are required to be transferred and bonded, increase the yield, and reduce the manufacturing cost. An electronic apparatus may include an inorganic LED display and the like. Furthermore, the present disclosure provides a method for improving the reliability of transferred and bonded devices.

Furthermore, the present disclosure provides a transfer/bonding process that does not require forming of a solder for micro devices for which solder forming is difficult.

The purposes of the present disclosure are not limited to the above-mentioned purposes, and other purposes not mentioned would be clearly understood by those skilled in the art from the disclosure below.

An embodiment of the inventive concept provides a method for transferring and bonding devices, the method including: forming an adhesive layer on a carrier; attaching a plurality of arranged devices onto the adhesive layer; forming a polymer film on a plurality of second electrodes of a substrate; aligning the carrier with the substrate so that a plurality of first electrodes attached to the adhesive layer and the plurality of second electrodes overlap each other; adjoining the aligned carrier to the substrate; bonding the plurality of devices to the second electrodes respectively by radiating infrared light onto the carrier; and releasing the carrier from the substrate to which the plurality of devices are bonded.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 1 is a cross-sectional view illustrating that an adhesive layer is applied to a carrier at an initial stage of a device transfer process;

FIG. 2 is a cross-sectional view illustrating that a plurality of devices are arranged before being attached to a carrier;

FIG. 3 is a cross-sectional view illustrating that the arranged devices of FIG. 2 are attached to the carrier of FIG. 1;

FIG. 4 is a cross-sectional view illustrating a substrate of a portion to which a device is bonded and a polymer film applied onto the substrate;

FIG. 5 is a cross-sectional view illustrating that during a process of transferring a carrier to which a device is attached to a substrate, the carrier is aligned with the substrate so that the device overlaps a second electrode on the substrate;

FIG. 6 is a cross-sectional view illustrating that a device is bonded to a substrate by radiating infrared light to a carrier;

FIG. 7 is a cross-sectional view illustrating that a substrate to which devices are attached and a carrier are separated;

FIG. 8 is a cross-sectional view illustrating that a polymer film is semi-permanently hardened after a carrier is released;

DETAILED DESCRIPTION

Hereinafter, embodiments of the inventive concept will be described with reference to the accompanying drawings so that the configuration and effects of the inventive concept are sufficiently understood.

The inventive concept is not limited to the embodiments described below, but may be implemented in various forms and may allow various changes and modifications. Rather, the embodiments are provided so that this disclosure will be thorough and complete, and will fully convey the scope of the inventive concept to those skilled in the art. In the accompanying drawings, the dimensions of elements are magnified for convenience, and the scale ratios among the elements may be exaggerated or reduced.

The terminology used herein is not for delimiting the inventive concept but for describing the embodiments of the inventive concept. Furthermore, the terms used herein may be interpreted as the meanings known in the art unless the terms are defined differently.

The terms of a singular form may include plural forms unless otherwise specified. It will be further understood that the terms "includes", "including", "comprises", and/or "comprising", when used in this specification, specify the presence of stated elements, steps, operations, and/or components, but do not preclude the presence or addition of one or more other elements, steps, operations, components, and/or groups thereof.

Hereinafter, embodiments of a method for transferring and bonding a device according to the inventive concept will be described in detail with reference to FIGS. 1 to 17.

Figure 1:
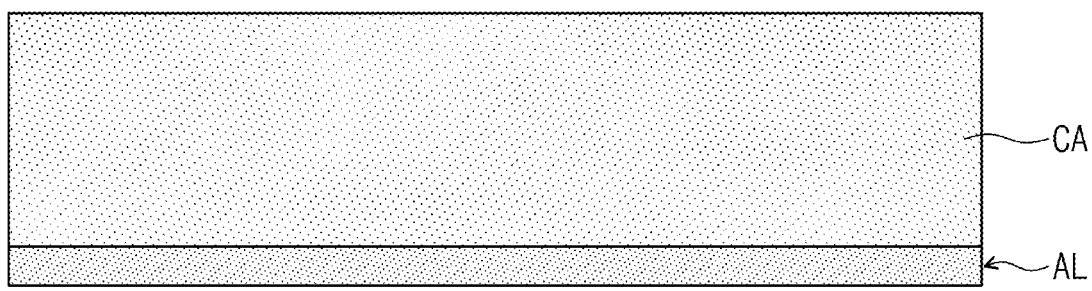
FIGS. 1 to 8 are cross-sectional views illustrating a method for transferring and bonding a device according to an embodiment of the inventive concept.

FIG. 1 is a cross-sectional view illustrating that an adhesive layer AL is applied to a carrier CA at an initial stage of a device transfer process. Referring to FIG. 1, the method for transferring and bonding a device according to an embodiment of the inventive concept may include applying the adhesive layer AL to the carrier CA so as to transfer a device to a substrate.

The adhesive layer AL may include a polymer material. The polymer material may have adhesiveness. Therefore, a plurality of devices DV may be attached to the adhesive layer AL formed on the carrier CA.

The polymer material may include an organic material including a siloxane bond. For example, the polymer material may include polydimethylsiloxane (PDMS). For another example, the polymer material may include polymerized siloxane. A chemical formula of the polydimethylsiloxane may be $CH_3[Si(CH_3)_2O]_nSi(CH_3)_3$.

Figure 17:
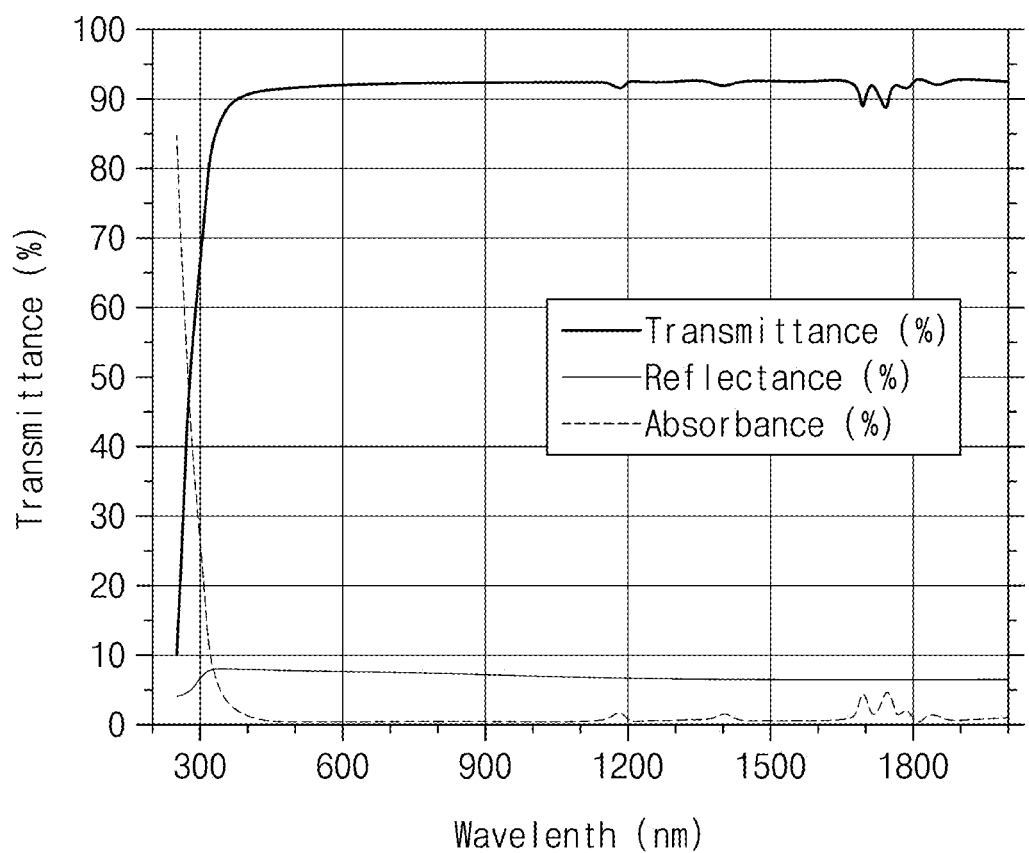
FIG. 17 is a graph illustrating a result of experiment related to infrared light transmittance of an adhesive layer.

The carrier CA and the adhesive layer AL may transmit infrared light IF. When transmittance for light of a particular wavelength band is at least 50%, the light of the wavelength band is defined to be transmittable. The infrared light IF may be light having a wavelength band of about 0.750 µm to about 1000 µm. More specifically, the infrared light IF may be light having a wavelength band of about 0.750 µm to about 2 µm. For example, the adhesive layer AL may transmit about 50% to about 99% of infrared light. More specifically, the adhesive layer AL may transmit about 80% to about 99% of infrared light. Referring to FIG. 17, in the case of the carrier CA to which polydimethylsiloxane is applied, the transmittance may be at least about 50% when a wavelength of radiated light is at least about 0.4 micrometers (µm). That is, infrared light may be transmitted.

Figure 2:
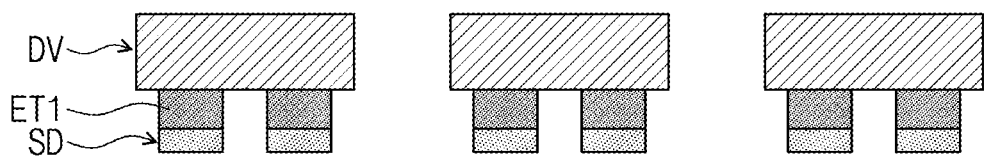

FIG. 2 is a cross-sectional view illustrating that the plurality of devices DV are arranged before being attached to a carrier. The plurality of devices DV may include micro devices having a size of several micrometers (µm). For example, the plurality of devices DV may include a micro LED.

For another example, the plurality of devices DV may include various devices required to be transferred and bonded to a substrate SUB through the carrier CA after being formed on another substrate. That is, the plurality of devices DV according to an embodiment of the inventive concept is not limited to a micro LED, and may include any electronic devices that require transfer and bonding processes. The plurality of devices DV according to an embodiment of the inventive concept are not limited in size, and may include, for example, devices having a size of several millimeters (mm). Each of the plurality of devices DV according to an embodiment of the inventive concept may include a plurality of first electrodes ET1, and is not limited to the number of first electrodes ET1.

Referring to FIG. 2, the first electrode ET1 may be attached to each of the plurality of devices DV. Furthermore, a solder SD may be attached to the first electrode ET1.

The solder may be a low melting point solder. The low melting point solder may include Sn, Bi, In, Ag, Pb, and/or Cu. For example, the low melting point solder may have a composition ratio of 60Sn/40Bi, 52In/48Sn, 97In/3Ag, 57Bi/42Sn/1Ag, 58Bi/42Sn, 52Bi/32Pb/16Sn, 96.5Sn/3Ag/0.5Cu, 96.5Sn/3.5Ag, and/or Sn.

The method for transferring and bonding a device according to an embodiment of the inventive concept may include arranging the plurality of devices DV in advance before attaching the plurality of devices DV to the carrier CA.

Figure 3:
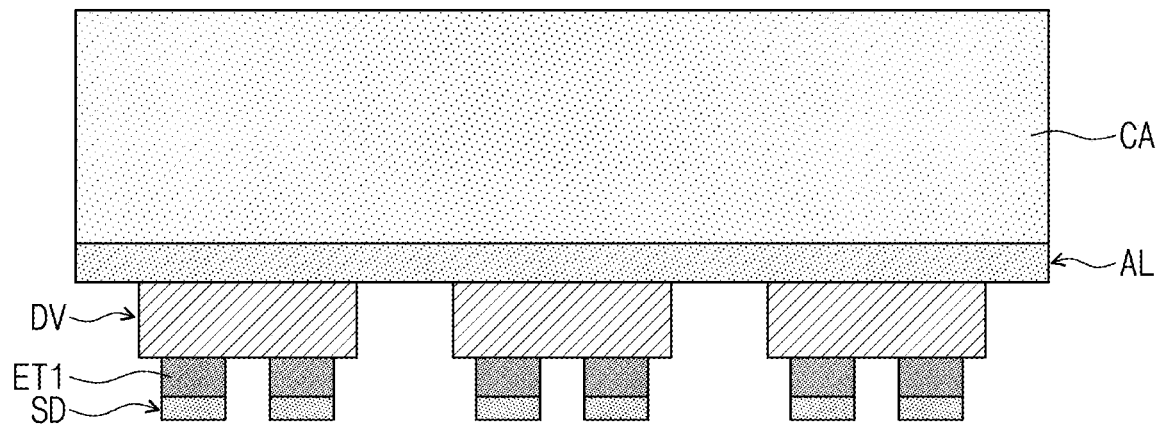

FIG. 3 is a cross-sectional view illustrating that the plurality of arranged devices DV of FIG. 2 are attached to the carrier CA. Referring to FIG. 3, the plurality of arranged devices DV may be attached intactly due to adhesive strength of the adhesive layer AL formed on the carrier CA. Therefore, the plurality of devices DV attached to the carrier CA may be moved at one time to a substrate.

Figure 4:
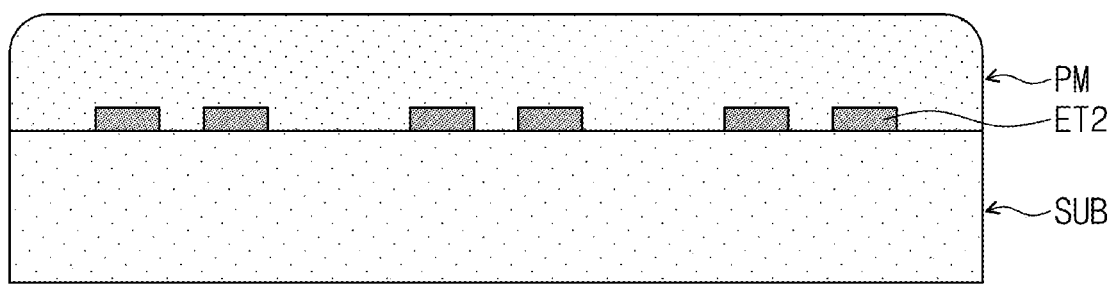

FIG. 4 is a cross-sectional view illustrating the substrate SUB of a portion to which a device is bonded and a polymer film PM applied onto the substrate SUB. Referring to FIG. 4, a second electrode ET2 may be arranged on the substrate SUB. Therefore, the plurality of devices DV and the substrate SUB may be electrically connected through the second electrode ET2.

The polymer film PM may include a polymer resin. The polymer resin may include a thermo-curable polymer resin. The thermo-curable polymer resin may be a thermosetting mixture. The thermosetting mixture may include a reducing agent or a hardening agent. The thermo-curable polymer resin may be hardened at a temperature higher than a melting point of the solder.

The polymer film PM may include an amine group or carboxyl group.

An oxide film formed on a surface of a solder particle may be removed by a material formed due to reaction between a hardening agent and a polymer resin or the reducing agent included in the thermosetting mixture. Therefore, the solder may be melted and thus may be easily agglomerated.

The polymer film PM may not volatilize when the solder SD reflows. Therefore, a region in which the plurality of devices DV and the second electrode ET2 are bonded may be capped around the solder SD. Furthermore, the polymer film PM may have a post-curing function.

Figure 5:
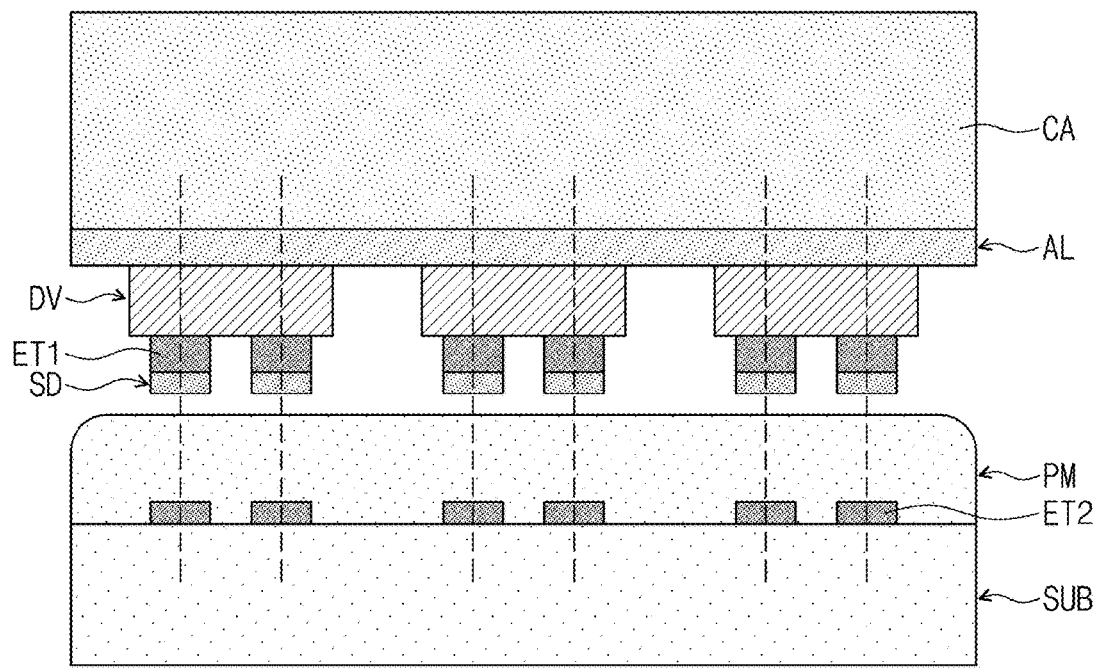

FIG. 5 is a cross-sectional view illustrating that the plurality of first electrodes ET1 and the plurality of second electrodes ET2 on a substrate are aligned so as to overlap each other during a process of transferring, to the substrate, the carrier CA to which the plurality of devices DV are attached. Referring to FIG. 5, the first electrodes ET1 of the plurality of devices DV attached to the carrier CA may be aligned so as to overlap the plurality of second devices ET2 on the substrate SUB. Therefore, since the devices are not aligned one by one, a time required for a manufacturing process may be reduced.

Figure 6:
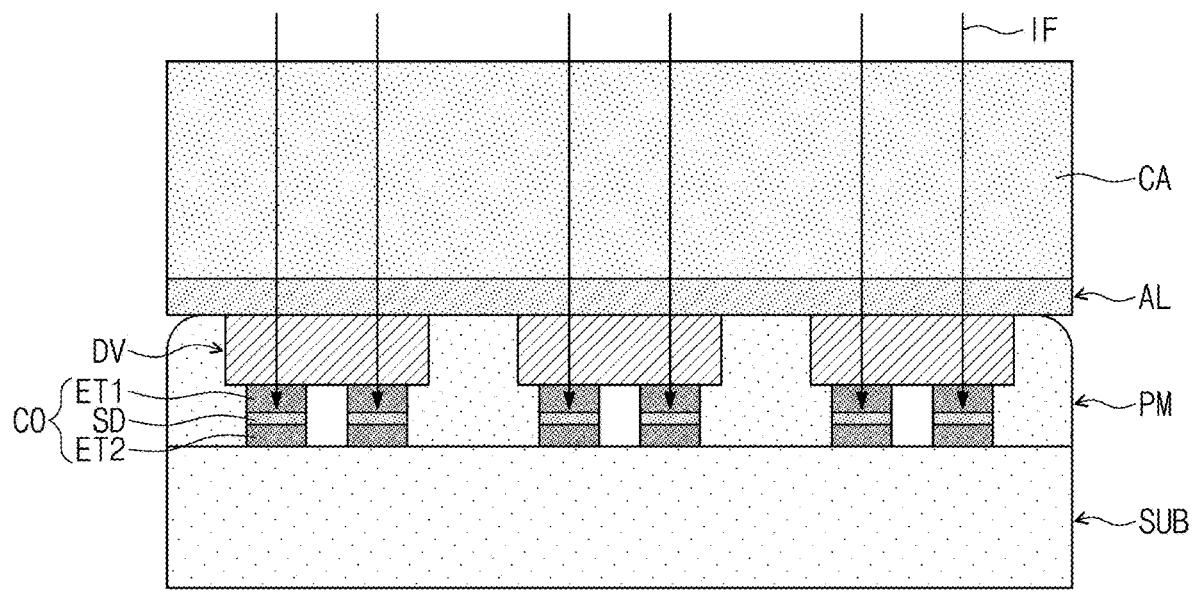

FIG. 6 is a cross-sectional view illustrating that the plurality of devices DV are bonded to the substrate SUB by radiating the infrared light IF to the carrier CA. Referring to FIG. 6, the first electrodes ET1 of the plurality of devices DV attached to the carrier CA may be adjoined to the plurality of second devices ET2 on the substrate SUB. Therefore, the solder SD attached to the first electrode ET1 and the second electrode ET2 may contact each other in the polymer film PM on the substrate SUB. Furthermore, at least a portion of the polymer film PM may directly contact the adhesive layer AL.

Thereafter, the infrared light IF may be radiated to the carrier CA. The infrared light IF may be transmitted through the carrier CA and the adhesive layer AL and radiated to the plurality of devices DV and the plurality of solders SD. For example, radiant energy may be delivered to the devices DV through the infrared light IF transmitted through the carrier CA and the adhesive layer AL. Heat may be delivered to the plurality of solders SD while the devices DV are heated by the radiant energy. Due to the heat transfer, a temperature of the solder SD becomes higher than the melting point thereof, and the solder SD may reflow. As a result, the first electrodes ET of the plurality of devices DV may be respectively bonded to the plurality of second electrodes ET2 on the substrate SUB by the plurality of solders SD.

When the bonding is completed, bonding force CO is formed by solder bonding between the first electrode ET1 and the second electrode ET2. The bonding force CO may be stronger than the bonding force between the adhesive layer AL and the polymer film PM. In other words, the bonding force CO formed by solder bonding may be significantly higher than the bonding force between the adhesive layer AL and the polymer film PM. Therefore, even though the bonding force between the adhesive layer AL and the polymer film PM is not adjusted, the carrier CA may be easily released without an additional process after a bonding process.

As a result, transferring and bonding of the plurality of devices DV may be simultaneously performed before releasing the carrier CA. In other words, transferring and bonding of devices may be simultaneously performed using one piece of equipment capable of radiating infrared light. That is, it may not be necessary to use additional transfer equipment for transferring devices.

According to the inventive concept, the time and cost required for a manufacturing process of an electronic product may be reduced. Furthermore, a transport process for transporting devices to a bonding apparatus after transferring the devices may be skipped. Thus, an issue of yield reduction that may occur during the transport process may be resolved.

Although not illustrated in the drawings, a time required for radiating laser one time may be about five seconds or less during a simultaneous transfer/bonding process, according to a result of experimentation according to an embodiment of the inventive concept. For example, an area of laser may be 30 mm×30 mm, and a distance between LED devices may be about 0.12 mm. In this case, the number of LED devices that may be bonded at one time during a simultaneous transfer/bonding process may be about 51000.

For another example, the simultaneous transfer/bonding process may include an aligning and pressing process. In this case, at least 36 million LEDs may be transferred and bonded per hour.

For another example, the areas of laser and a first substrate may be extended. In this case, the simultaneous transfer/bonding process according to an embodiment of the inventive concept may be performed more quickly.

Figure 7:
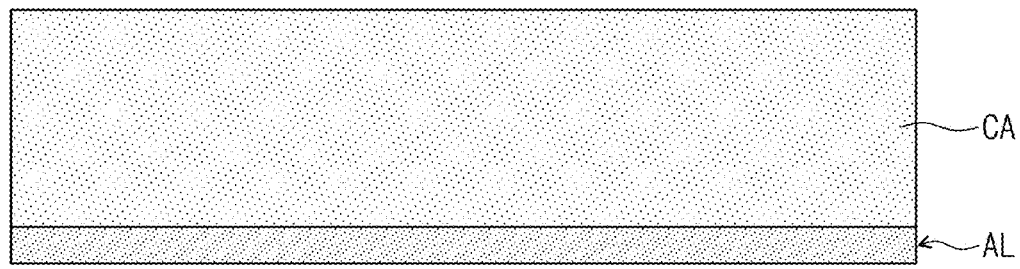

FIG. 7 is a cross-sectional view illustrating that the substrate SUB to which devices are attached and the carrier CA are separated. Referring to FIG. 7, the carrier CA may be released from the substrate SUB after solder bonding is finished.

Although not illustrated, after the transfer and bonding process is completed, inspecting a defective device may be further performed. Thereafter, removing a defective device may be further performed. A device may be transferred and bonded again to a portion from which the defective device has been removed, and this process may be repeatedly performed until defective devices are completely removed.

Figure 8:
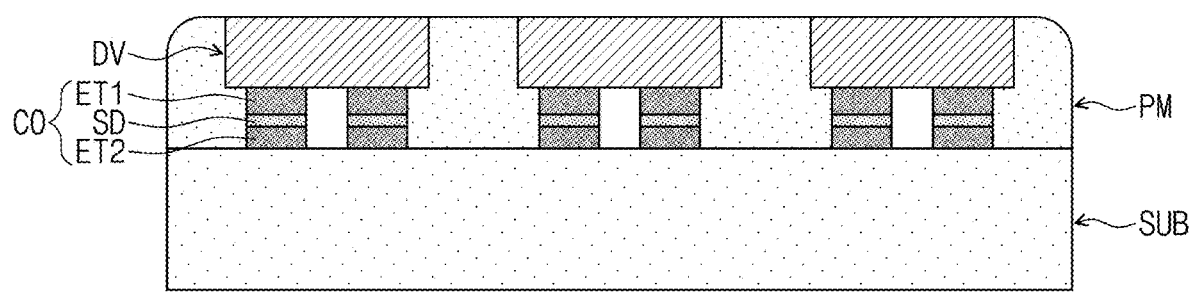

FIG. 8 is a cross-sectional view illustrating that the polymer film PM is semi-permanently hardened after the carrier CA is released from the substrate SUB. After the transfer and bonding process and the process of inspecting/removing defective devices are completed, the polymer film may be semi-permanently hardened. Due to the semi-permanently hardened polymer film PM, reliability of the plurality of devices DV bonded to the substrate SUB may be improved.

The hardened polymer film PM may perform a function of underfill. According to the inventive concept, a process of underfill between the devices DV and the substrate SUB may be skipped due to the hardening of the polymer film PM. Therefore, a process fault that may occur due to the underfill process may be prevented, and a level of process difficulty caused by the underfill process may be reduced.

FIGS. 9 to 12 are cross-sectional views illustrating a method for transferring and bonding a device according to embodiments of the inventive concept. Descriptions that overlap with the descriptions provided above with reference to FIGS. 1 to 8 are not provided below.

Figure 9:
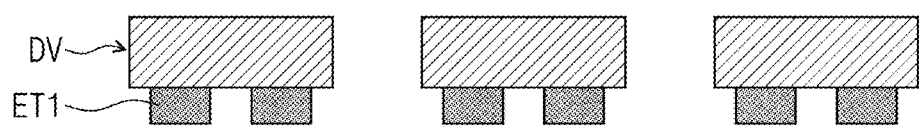
FIG. 9 is a cross-sectional view illustrating a state in which solder is not attached to the devices of FIG. 2.

Referring to FIGS. 2, 4, 9, and 10, the solder SD may not be attached to the plurality of devices DV as illustrated in FIG. 9. In this case, the polymer film PM applied onto the substrate SUB may include solder powder SP. A size of particles of the solder powder SP may be smaller than a size of each device DV.

Figure 10:
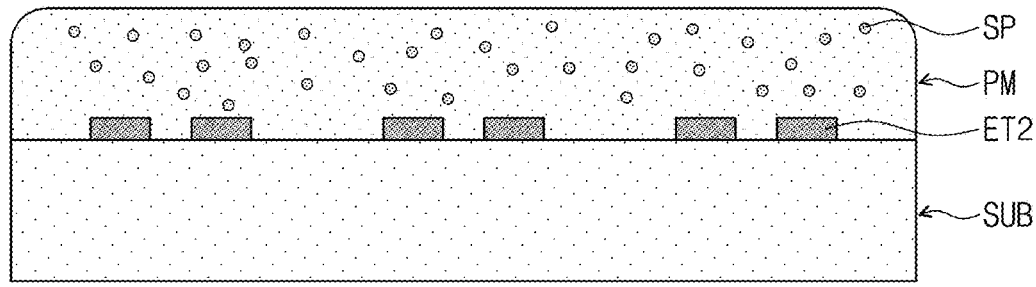
FIG. 10 is a cross-sectional view illustrating that solder powder is added to the polymer film on the substrate of FIG. 3.

FIG. 10 is a cross-sectional view illustrating that the solder powder SP is added to the polymer film PM on the substrate SUB. Here, polymer spheres may be further added to the polymer film PM. For example, the polymer spheres may include PMMA, polysiloxane, or polyimide.

Figure 11:
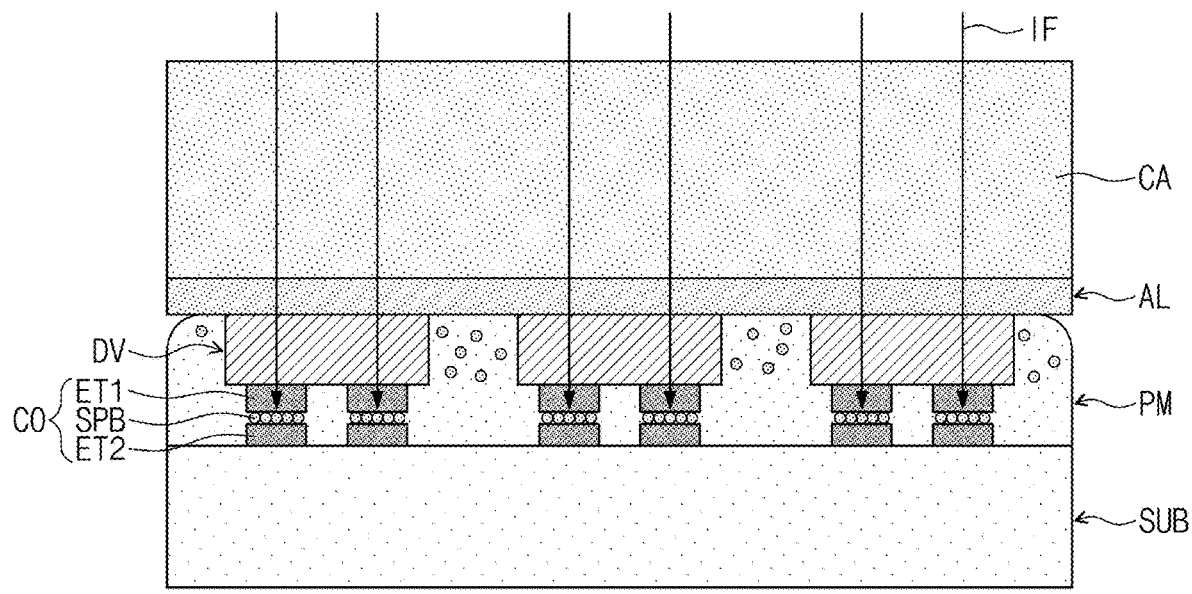
FIG. 11 is a cross-sectional view illustrating that the electrodes of FIG. 9 are bonded to the substrate of FIG. 10.

FIG. 11 is a cross-sectional view illustrating that the plurality of devices DV of FIG. 9 attached to the carrier CA as illustrated in FIG. 6 are bonded onto the substrate of FIG. 10. Referring to FIG. 11, the infrared light IF may be radiated to the carrier CA. The infrared light IF may be transmitted through the carrier CA and the adhesive layer AL and radiated to the plurality of devices DV. Likewise, radiant energy may be delivered to the devices DV through the infrared light IF transmitted through the carrier CA and the adhesive layer AL. Heat may be delivered to the solder powder SP between the first electrode ET1 and the second electrode ET2 while the devices DV are heated by the radiant energy. Here, the solder powder SPB may reflow. Therefore, the first electrode ET1 and the second electrode ET2 may be bonded. As in the embodiment of FIG. 6, the bonding force CO between the first electrode ET1 and the second electrode ET2 may be stronger than the bonding force between the adhesive layer AL and the polymer film PM.

Figure 12:
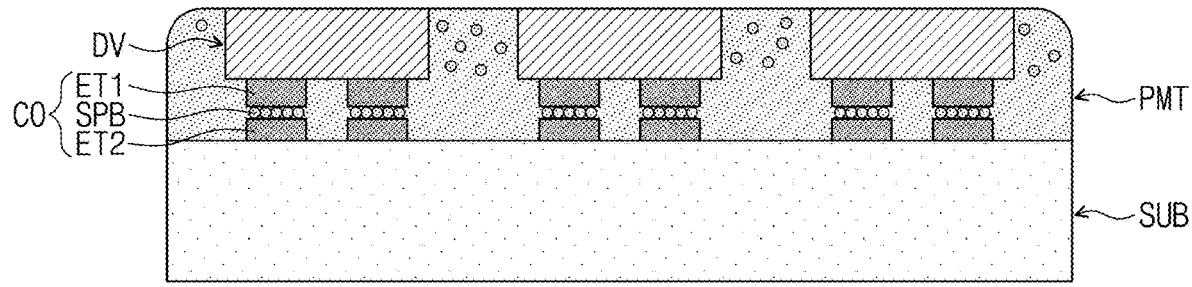
FIG. 12 is a cross-sectional view illustrating that a polymer film is hardened after the devices are bonded to the substrate as illustrated in FIG. 11.

FIG. 12 is a cross-sectional view illustrating that the polymer film PM is hardened after releasing the carrier CA after bonding the plurality of devices DV to the substrate SUB as illustrated in FIG. 11. As in the embodiment of FIG. 8, the reliability of the devices may be improved due to the hardened polymer film PMT.

Figure 13:
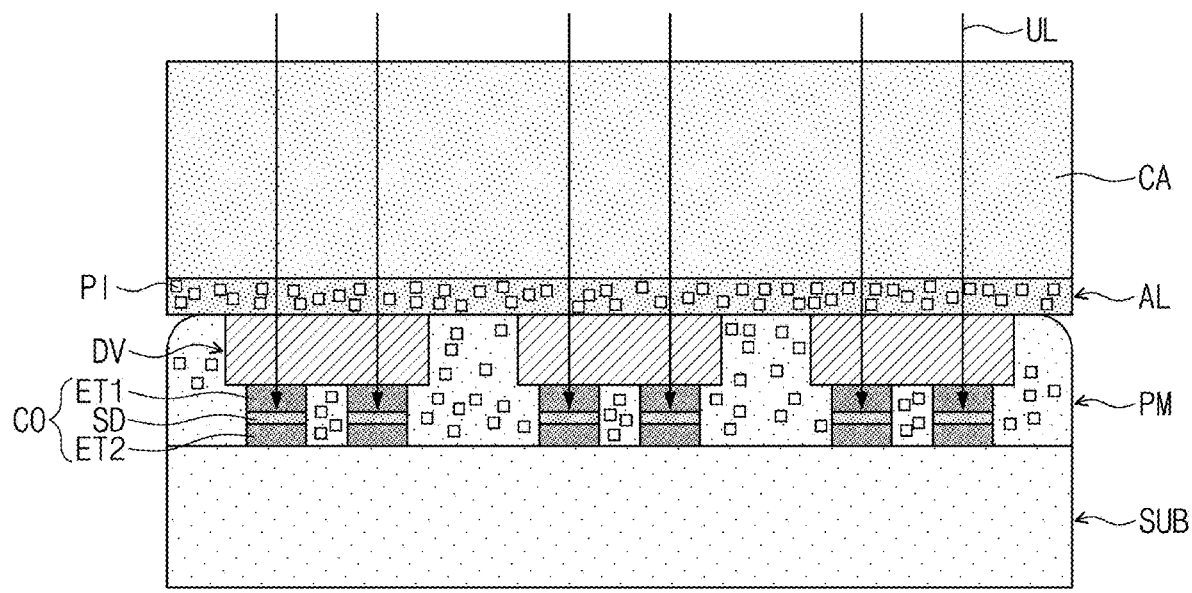
FIG. 13 is a cross-sectional view illustrating that ultraviolet light is radiated to a carrier.

Referring to FIG. 13, the method for transferring and bonding a device according to an embodiment of the inventive concept may further include radiating ultraviolet light UL to the carrier CA. The adhesive layer AL of the carrier CA may be capable of transmitting the ultraviolet light UL. The ultraviolet light may have a wavelength of about 10 nanometers (nm) to about 400 nanometers (nm). A photoinitiator PI may be included in the adhesive layer AL or the polymer film PM.

The photoinitiator PI may react with the ultraviolet light UL. Therefore, the adhesiveness between the adhesive layer AL and the plurality of devices DV or the polymer film PM may reduce. That is, the adhesiveness between the adhesive layer AL and the plurality of devices DV or the polymer film PM may be controlled by radiating the ultraviolet light UL to the carrier CA. As a result, the carrier CA may be easily released from the substrate SUB.

Figure 14:
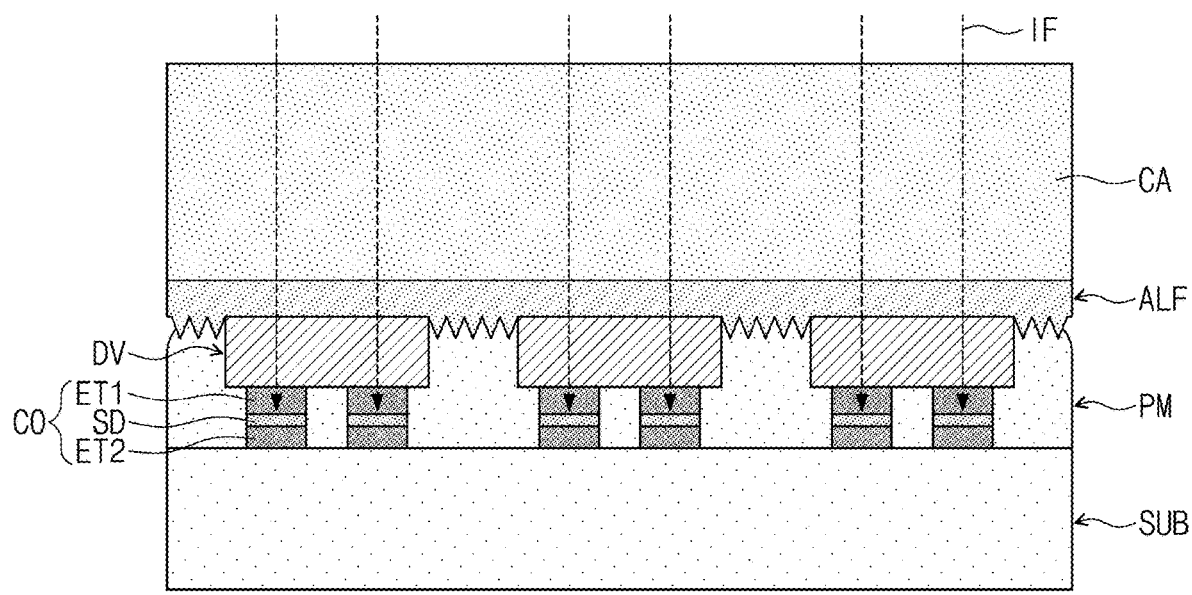
FIG. 14 is a cross-sectional view illustrating that a plurality of devices are bonded when protrusions and recesses are formed in an adhesive layer attached to a carrier.
Figure 15:
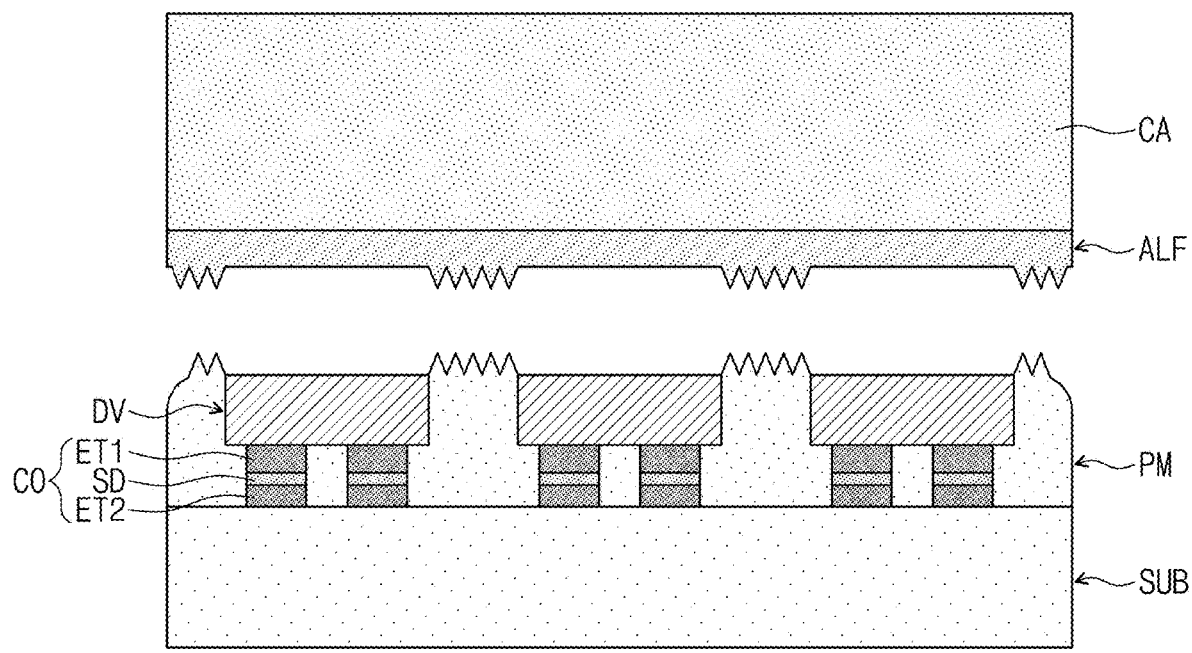
FIG. 15 is a cross-sectional view illustrating a state in which a carrier is released from a substrate after the bonding of FIG. 14 is performed.

Referring to FIG. 14, the method for transferring and bonding a device according to an embodiment of the inventive concept may include forming an adhesive layer ALF having protrusions and recesses on the carrier CA. Referring to FIG. 15, due to the protrusions and recesses of the adhesive layer ALF, protrusions and recesses may be formed in a surface of the polymer film PM after bonding the plurality of devices DV. Since the protrusions and recesses are formed, scattered reflection of light on the substrate SUB may be suppressed.

Figure 16:
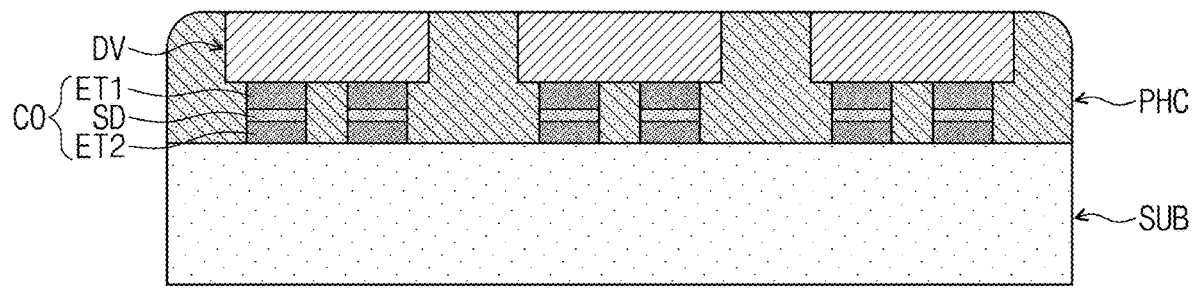
FIG. 16 is a cross-sectional view for describing a color contrast between a substrate and a polymer film after bonding and releasing processes when black powder is added to the polymer film.

Referring to FIG. 16, the method for transferring and bonding a device according to an embodiment of the inventive concept may use a polymer film PMC in which black powder is added. The black powder may include carbon. Therefore, a contrast between a bright portion of the substrate SUB and a dark portion of the polymer film PMC may be improved after a device bonding process is completed.

According to the method for transferring and bonding devices according to an embodiment of the inventive concept, an adhesive layer capable of transmitting infrared light may be used to transfer a plurality of electronic devices attached to the adhesive layer to a target substrate and simultaneously bond the electronic devices to the target substrate. Therefore, the time required for a manufacturing process of an electronic product may be significantly reduced.

According to the method for transferring and bonding devices according to an embodiment of the inventive concept, the adhesiveness between a carrier and a substrate is controlled to easily release the carrier by radiating ultraviolet light during a transfer and bonding process.

According to the method for transferring and bonding devices according to an embodiment of the inventive concept, the reliability of bonded devices may be improved by semi-permanently hardening functional devices after a transfer and bonding process is completed.

According to the method for transferring and bonding devices according to an embodiment of the inventive concept, micro protrusions and recesses formed in a polymer film may suppress scattered reflection of light on a substrate.

According to the method for transferring and bonding devices according to an embodiment of the inventive concept, a polymer film to which black powder including carbon is added may improve the contrast between a dark portion and a bright portion of a substrate.

The effects of the inventive concept are not limited to the above-mentioned effects, and other effects not mentioned would be clearly understood by those skilled in the art.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method for transferring and bonding devices, the method comprising:
    forming an adhesive layer on a carrier, wherein the carrier and the adhesive layer are configured to transmit infrared light;
    attaching a plurality of arranged devices onto the adhesive layer, the plurality of devices comprising a plurality of first electrodes respectively;
    forming a polymer film on a plurality of second electrodes of a substrate;
    aligning the carrier with the substrate so that the plurality of first electrodes and the plurality of second electrodes overlap each other;
    adjoining the aligned carrier to the substrate;
    bonding the plurality of devices to the second electrodes respectively by radiating the infrared light onto the carrier;
    releasing the carrier from the substrate to which the plurality of devices are bonded; and
    radiating ultraviolet light onto the carrier after radiating the infrared light,
    wherein a bonding force between the plurality of devices and the second electrodes becomes higher than a bonding force between the adhesive layer and the plurality of devices due to the radiating of the infrared light, and
    wherein adhesiveness of the adhesive layer decreases due to the radiating of the ultraviolet light.

2. The method of claim 1, wherein the polymer film comprises a thermo-curable polymer resin.

3. The method of claim 1,
    wherein the polymer film further comprises a photoinitiator that reacts with the ultraviolet light,
    at least a portion of the polymer film directly contacts the adhesive layer, and
    adhesiveness between the adhesive layer and the polymer film decreases due to the radiating of the ultraviolet light.

4. The method of claim 1, wherein the adhesive layer further comprises a photoinitiator that reacts with the ultraviolet light.

5. The method of claim 1, further comprising
    forming a first protrusion-and-recess structure in a surface of the adhesive layer exposed between the plurality of devices,
    wherein the polymer film comprises, in a surface thereof, a second protrusion-and-recess structure transferred by the first protrusion-and-recess structure.

6. The method of claim 1,
    wherein the polymer film comprises solder powder, and the solder powder bonds the plurality of first electrodes and the plurality of second electrodes therebetween due to the radiating of the infrared light.

7. The method of claim 1, wherein the carrier is a transparent substrate.

8. The method of claim 1, further comprising hardening the polymer film that fills a gap between the plurality of devices and the substrate after releasing the carrier from the substrate.

9. The method of claim 1, wherein the adhesive layer comprises a polymer material capable of transmitting about 50% to about 99% of the infrared light.

10. The method of claim 9, wherein the polymer material comprises polydimethylsiloxane.

11. The method of claim 1, further comprising
forming a plurality of solders on the plurality of first electrodes respectively,
wherein the plurality of solders are reflow-treated and bonded to the second electrodes respectively due to the radiating of the infrared light.

12. The method of claim 11, wherein the polymer film surrounds and caps the plurality of solders while the plurality of solders are reflow-treated.

* * * * *